United States Patent

Abbott et al.

[15] 3,666,970

[45] May 30, 1972

[54] LIMITER CIRCUIT

[72] Inventors: Matthew C. Abbott, Wakefield; Albert H. Ashley, Holliston; Kenneth A. Garrigus, Foxboro, all of Mass.

[73] Assignee: GTE Sylvania Incorporated

[22] Filed: Mar. 15, 1971

[21] Appl. No.: 124,224

[52] U.S. Cl. ..............................307/237, 307/235, 307/264, 307/290

[51] Int. Cl. ..........................................................H03k 5/08

[58] Field of Search..................307/229, 230, 235, 237, 261, 307/264, 290

[56] References Cited

UNITED STATES PATENTS

| | | | |
|---|---|---|---|
| 3,324,309 | 6/1967 | Zeller, Jr. | 307/290 |
| 3,416,004 | 12/1968 | Taylor | 307/290 X |
| 3,569,739 | 3/1971 | Stolman | 328/146 X |

*Primary Examiner*—John Zazworsky
*Attorney*—Norman J. O'Malley, Elmer J. Nealon and David M. Keay

[57] ABSTRACT

A limiter circuit employing a high gain differential voltage comparator. A positive quiescent voltage is established on the inverting input of the comparator at which input signals are applied. The output of the comparator is coupled to the non-inverting input through a feedback arrangement so as to establish a threshold voltage which is positive with respect to the quiescent voltage until the input signal exceeds the positive threshold voltage and the output of the comparator changes from a high to a low level. Then the feedback arrangement establishes a threshold voltage which is negative with respect to the quiescent voltage until the input signal exceeds the negative threshold voltage and the output of the comparator changes from the low to the high level. Thus, a square-wave output is produced at the output of the comparator.

5 Claims, 2 Drawing Figures

INVENTORS
Mathew C. Abbott
Albert H. Ashley
Kenneth A. Garrigus
By David M. Keay
Agent

LIMITER CIRCUIT

BACKGROUND OF THE INVENTION

This invention relates to limiter circuits. More particularly, it is concerned with circuits for producing a square-wave of symmetrical proportions and definite amplitude for all levels of input signals above a threshold.

High gain amplifiers which clip the output signal at a desired level have been employed as limiter circuits. However, with limiters of this type the output signal has the same relative shape as the input signal below the clipping voltage and thus the rise and fall times of the output depend on the magnitude of the input and the gain of the amplifier. Another form of limiter circuit is a standard Schmitt trigger circuit. However, there is a loss of symmetry in the output signal of a Schmitt trigger circuit which depends on the level at which the threshold is set.

SUMMARY OF THE INVENTION

An improved limiter circuit in accordance with the invention employs a differential amplifier having first and second input terminals and an output terminal. The differential amplifier produces a first output condition at its output terminal in response to a voltage differential of one polarity between the first and second input terminals, and produces a second output condition at the output terminal in response to a voltage differential of the opposite polarity between the first and second input terminals.

The circuit includes a quiescent voltage means which is connected to the signal input terminal and to the second input terminal of the differential amplifier, and produces a quiescent voltage at the second input terminal. A voltage reference means is connected to the first input terminal of the differential amplifier and the output terminal of the differential amplifier. The reference voltage means produces a first reference voltage at the first input terminal when the first output condition is present at the output terminal, and produces a second reference voltage at the first input terminal when the second output condition is present at the output terminal. The first reference voltage produced by the voltage reference means is of the one polarity with respect to the quiescent voltage, and the second reference voltage is of the opposite polarity with respect to the quiescent voltage.

When an increasing voltage of the one polarity at the signal input terminal causes the voltage at the second input terminal of the differential amplifier to exceed the first reference voltage, the second output condition is produced at the output terminal of the differential amplifier. When an increasing voltage of the opposite polarity at the signal input terminal causes the voltage at the second input terminal of the differential amplifier to exceed the second reference voltage, the first output condition is produced at the output of the differential amplifier.

BRIEF DESCRIPTION OF THE DRAWINGS

Additional objects, features, and advantages of limiter circuits in accordance with the present invention will be apparent from the following detailed discussion together with the accompanying drawings wherein.

DETAILED DESCRIPTION OF THE INVENTION

Figure 1:
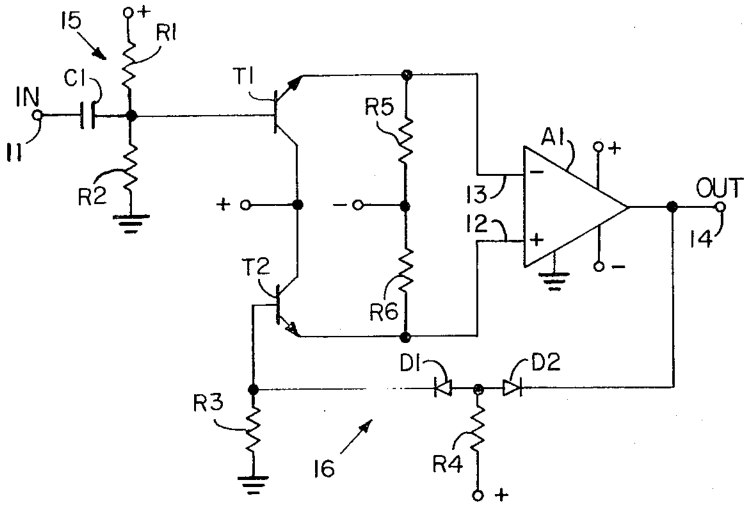
FIG. 1 is a schematic circuit diagram of a limiter circuit in accordance with the invention.

The limiter circuit in accordance with the invention as illustrated in FIG. 1 includes a differential amplifier A1. The amplifier A1 has a non-inverting input terminal 12, an inverting input terminal 13, and an output terminal 14 which is the output terminal of the circuit. The amplifier also has terminals for applying operating voltages. The amplifier operates in a known manner to produce a relatively high output voltage level at the output terminal when the voltage level at the non-inverting input terminal 12 is more positive than the voltage at the inverting input terminal 13, and to produce a relatively low output voltage level, near ground, when the voltage level at the inverting input terminal 13 is more positive than the voltage level at the non-inverting input terminal 12.

The input terminal 11 of the limiter circuit is connected through a coupling capacitor C1 to a quiescent voltage network 15. The quiescent voltage network includes a pair of resistances R1 and R2 connected in series as a voltage divider between a positive source of voltage and ground. The input signal terminal 11 is connected through the capacitance C1 to the juncture of the two resistances R1 and R2. The juncture of the two resistances R1 and R2 is connected to the base of an NPN transistor T1 which has its emitter connected to the inverting input terminal 13 of the differential amplifier A1. The collector of transistor T1 is connected to a positive source of voltage and the emitter is connected through an emitter resistance R5 to a negative source of voltage.

The non-inverting input terminal 12 of the amplifier A1 is connected to the output terminal 14 through a feedback arrangement 16. The feedback arrangement includes a resistance R4 having one terminal connected to a positive source of voltage and the other connected to the anodes of two diodes D1 and D2. The cathode of diode D2 is connected directly to the output terminal 14 of the amplifier A1. The cathode of the other diode D1 is connected through a resistance R3 to ground. The juncture of resistance R3 and the cathode of diode D1 is connected to the base of an NPN transistor T2. The collector of transistor T2 is connected to a positive source of voltage and the emitter is connected through an emitter resistance R6 to a negative source of voltage. The emitter of transistor T2 is connected directly to the non-inverting input terminal 12 of the amplifier A1.

The transistor T1 is included in the input path from the input terminal 11 to the inverting input 13 of the differential amplifier A1 in order to reduce the effects of input bias current on the amplifier during low level signals. Transistor T2 is similarly connected in the path between the feedback arrangement and the non-inverting input terminal 12 of the differential amplifier A1 in order to balance transistor T1 in the path to the other input terminal.

The circuit of FIG. 1 operates in the following manner with an input signal as illustrated at curve 21 of FIG. 2 to produce an output signal shown at curve 22 in FIG. 2.

During a positive-going portion of the input signal 21 the output voltage level of the amplifier A1 at the output terminal 14 is relatively high. This output voltage reverse biases diode D2 and current flow from the positive voltage source through resistance R4 passes through the forward biased diode D1 and resistance R3 to ground. The current flowing through the resistance R3 produces a reference voltage at the non-inverting input terminal 12 of the amplifier A1 which establishes the + threshold as shown in FIG. 2. Since this voltage is positive with respect to the voltage at the inverting input terminal 13 established by the quiescent voltage network 15, the amplifier A1 produces the relatively high output voltage at its output terminal 14.

When the input signal 21 reaches the + threshold level set by the feedback arrangement 16 (point *a*), the voltage at the inverting input 13 of the differential amplifier A1 becomes greater than that at the non-inverting input 12. The output voltage at the amplifier A1 output 14 changes to the relatively low level as shown in curve 22. Under these conditions diode D2 becomes forward-biased and current flows from the positive voltage source through resistance R4 and the forward-biased diode D2 to the output terminal 14. This action reverse biases diode D1 and current does not flow through resistance R3. The voltage thus produced at the non-inverting input terminal 12 establishes the − threshold as shown in FIG. 2.

After the input signal peaks and then drops in voltage below the − threshold level (point *b*) the inverting input 13 becomes negative with respect to the non-inverting input 12. The output condition at the output terminal 14 of the amplifier A1 changes to the relatively high level as shown in curve 22. Under these conditions diode D2 becomes reverse biased and current flows through resistance R4, the forward-biased diode D1, and resistance R3 to ground re-establishing the + threshold level.

Figure 2:
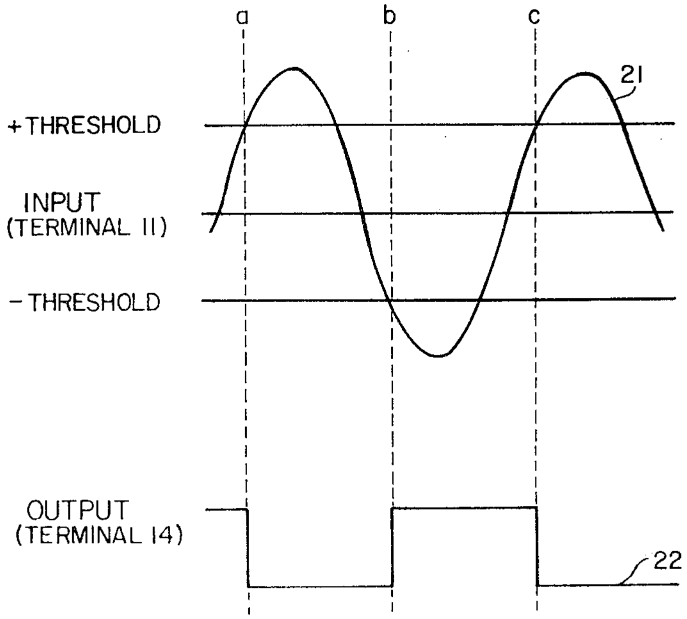
FIG. 2 illustrates a voltage curve of an input signal which may be applied at the input terminal of the circuit of FIG. 1 and a voltage curve of the resulting output.

During subsequent cycles of the input signal 21 the operation of the limiter circuit is repeated to produce the output signal 22 in the manner previously described and as indicated at point *c*, for example, of the curves in FIG. 2.

Thus, the limiter circuit as shown and described provides a square-wave output. If the threshold voltages are equal, the sinusoidal input signal produces a symmetrical square-wave output signal. No portion of the output signal of the circuit is linear with respect to the input signal. Thus, the circuit provides uniform, rapid rise and fall times regardless of the shape of the input signal.

A limiter circuit in accordance with FIG. 1 has been fabricated employing the particular components as listed below.

| | |
|---|---|
| A1 | 710 Differential Comparator |
| T1, T2 | CA 3045 transistor |
| D1, D2 | 1N 4148 |
| R1 | 86.6 KΩ |
| R2 | 1 KΩ |
| R3 | 2 KΩ |
| R4 | 82.5 KΩ |
| R5 | 100 KΩ |
| R6 | 100 KΩ |
| C1 | 4.7 μf |
| voltage at + terminal of quiescent voltage network 15 | +12 volts |
| voltage at + terminal of feedback arrangement 16 | +12 volts |

The quiescent voltage established in the circuit was 140 millivolts positive. The + threshold level was 140 millivolts above the quiescent value and the − threshold level was 140 millivolts below the quiescent value, or at ground. The circuit operated satisfactorily with no output signal at input levels up to 260 millivolts peak-to-peak and with a symmetrical square-wave output at input levels of 300 millivolts peak-to-peak at frequencies from 50 hertz to 100 kilohertz.

While there has been shown and described what is considered a preferred embodiment of the present invention, it will be obvious to those skilled in the art that various changes and modifications may be made therein without departing from the invention as defined in the appended claims.

What is claimed is:

1. A limiter circuit including in combination a differential amplifier having first and second input terminals and an output terminal, said differential amplifier being operable to produce a first output condition at the output terminal in response to a voltage differential of one polarity between the first and second input terminals, and being operable to produce a second output condition at the output terminal in response to a voltage differential of the opposite polarity between the first and second input terminals;

a signal input terminal;

quiescent voltage means connected to the input signal terminal and to the second input terminal of the differential amplifier for providing a quiescent voltage at said terminal;

reference voltage means connected to the first input terminal of the differential amplifier and the output terminal of the differential amplifier and operable to produce a first reference voltage at the first input terminal when the first output condition is present at the output terminal of the differential amplifier and operable to produce a second reference voltage at the first input terminal when the second output condition is present at the output terminal of the differential amplifier; said first reference voltage being of the one polarity with respect to the quiescent voltage and said second reference voltage being of the opposite polarity with respect to the quiescent voltage;

whereby when an increasing voltage of the one polarity at the signal input terminal causes the voltage at the second input terminal of the differential amplifier to exceed said first reference voltage, the second output condition is produced at the output terminal of the differential amplifier; and when an increasing voltage of the opposite polarity at the signal input terminal causes the voltage at the second input terminal of the differential amplifier to exceed said second reference voltage, the first output condition is produced at the output of the differential amplifier;

wherein said reference voltage means includes a first source of reference potential of the one polarity;

a first resistance having one terminal connected to said first source of reference potential;

a second source of reference potential of the opposite polarity with respect to said first source of reference potential;

a second resistance having one terminal connected to said second source of reference potential and the other terminal connected to the first input terminal of the differential amplifier;

a first diode connected between the other terminal of the first resistance and the other terminal of the second resistance, the first diode being arranged to permit current flow between the first source and the second source of reference potential;

a second diode connected between the other terminal of the first resistance and the output terminal of the differential amplifier, the second diode being arranged to permit current flow between the first source of reference potential and the output terminal of the differential amplifier when the second output condition is present at the output terminal of the differential amplifier;

the presence of the first output condition at the output terminal of the differential amplifier causing current to flow between the first and second source of reference potential through the first and second resistances, the current flow through the first resistance reverse biasing the second diode and current flow through the second resistance establishing said first reference voltage at the first input terminal of the differential amplifier; and the presence of the second output condition at the output terminal of the differential amplifier causing current to flow between the first source of reference potential and the output terminal through the first resistance, current flow through the first resistance reverse biasing the first diode and causing the second source of reference potential to establish the second reference voltage at the first input terminal of the differential amplifier.

2. A limiter circuit in accordance with claim 1 wherein said quiescent voltage means includes two resistances connected in series between a third source of reference potential of the one polarity and a fourth source of reference potential of the opposite polarity with respect to said third source of reference potential;

the signal input terminal is connected to the juncture of the two resistances of the quiescent voltage means; and the second input terminal of the differential amplifier is connected to the juncture of the two resistances of the quiescent voltage means.

3. A limiter circuit in accordance with claim 2 wherein said one polarity is positive with respect to ground and said opposite polarity is negative with respect to ground;

said first output condition at the output terminal of the differential amplifier is a relatively high voltage level with respect to ground and the second output condition at the output terminal of the differential amplifier is a relatively low voltage level with respect to ground;

said first and third sources of reference potential are positive with respect to ground; and said second and fourth sources of reference potential are at ground potential.

4. A limiter circuit in accordance with claim 3 wherein said first reference voltage is positive with respect to said quiescent voltage and differs from the quiescent voltage by a predetermined amount; and said second reference voltage is negative with respect to said quiescent voltage and differs from the quiescent voltage by said predetermined amount.

5. A limiter circuit in accordance with claim 4 wherein said differential amplifier is a differential voltage comparator with the first input terminal being a non-inverting input terminal and the second input terminal being an inverting input terminal.

* * * * *